US011302269B2

(12) United States Patent
Kim et al.

(10) Patent No.: US 11,302,269 B2
(45) Date of Patent: Apr. 12, 2022

(54) ORGANIC LIGHT EMITTING DIODE DISPLAY DEVICE, AND METHOD OF OPERATING AN ORGANIC LIGHT EMITTING DIODE DISPLAY DEVICE

(71) Applicant: SAMSUNG DISPLAY CO., LTD., Yongin-si (KR)

(72) Inventors: Kyunho Kim, Yongin-si (KR); Sangan Kwon, Cheonan-si (KR); Yong-Jin Shin, Asan-si (KR); Joonsuk Baik, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/237,197

(22) Filed: Apr. 22, 2021

(65) Prior Publication Data
US 2021/0383763 A1 Dec. 9, 2021

(30) Foreign Application Priority Data

Jun. 9, 2020 (KR) ........................ 10-2020-0069486

(51) Int. Cl.
*G09G 3/3291* (2016.01)
*H01L 27/32* (2006.01)

(52) U.S. Cl.
CPC ......... *G09G 3/3291* (2013.01); *H01L 27/326* (2013.01); *H01L 27/3276* (2013.01); *G09G 2330/045* (2013.01)

(58) Field of Classification Search
CPC .. G09G 3/3291; G09G 3/3233; H01L 27/326; H01L 27/3276
See application file for complete search history.

(56) References Cited

U.S. PATENT DOCUMENTS

| | | | | |
|---|---|---|---|---|
| 10,373,542 | B2* | 8/2019 | Jung | G09G 3/3258 |
| 11,049,474 | B2* | 6/2021 | Kim | G09G 5/10 |
| 2014/0354624 | A1* | 12/2014 | Chaji | G09G 3/3233 |
| | | | | 345/212 |
| 2016/0293101 | A1* | 10/2016 | Jeong | G09G 3/2007 |
| 2021/0272519 | A1* | 9/2021 | Cao | G09G 3/3233 |

FOREIGN PATENT DOCUMENTS

KR  10-0923347  10/2009

* cited by examiner

*Primary Examiner* — Sardis F Azongha
(74) *Attorney, Agent, or Firm* — F. Chau & Associates, LLC

(57) ABSTRACT

An organic light emitting diode (OLED) display includes pixel rows, and a panel driver configured to drive the display panel. The panel driver includes a determining circuit configured to select one pixel row from the plurality of pixel rows, to determine load data based on input image data for the one pixel row, and to determine target mobility data corresponding to the load data, a sensing circuit configured to generate mobility sensing data corresponding to mobility values of driving transistors of a plurality of pixels included in the one pixel row by performing a mobility sensing operation on the one pixel row, and a current control circuit configured to compare the mobility sensing data and the target mobility data to generate a result, and to adjust a panel current flowing through the display panel according to the result.

20 Claims, 13 Drawing Sheets

| LOAD DATA | TARGET MOBILITY DATA |
|---|---|
| 1% | TMD1 |
| 5% | TMD2 |
| 10% | TMD3 |
| 20% | TMD4 |
| 30% (RLD) | TMD5 (MTMD) |

ORGANIC LIGHT EMITTING DIODE DISPLAY DEVICE, AND METHOD OF OPERATING AN ORGANIC LIGHT EMITTING DIODE DISPLAY DEVICE

CROSS-REFERENCE TO RELATED APPLICATION(S)

This non-provisional patent application claims priority under 35 USC § 119 to Korean Patent Application No. 10-2020-0069486, filed on Jun. 9, 2020 in the Korean Intellectual Property Office (KIPO), the disclosure of which is incorporated by reference in its entirety herein.

BACKGROUND

1. Technical Field

Exemplary embodiments of the present inventive concept relate to display devices, and more particularly to organic light emitting diode (OLED) display devices, and methods of operating the OLED display devices.

2. Discussion of Related Art

A display device, such as an organic light emitting diode (OLED) display device, includes a display panel with multiple pixels for displaying an image. The current flowing in the pixels during operation of the OLED display may be referred to as a panel current. Power consumption may be reduced if the panel current is controlled not to exceed a predetermined maximum current. The control of the panel current includes sensing a value of the panel current. For example, the panel current may be sensed by using a serial resistor that is connected in series with the display panel. However, since a serial resistor having a very large resistance value is required to sense the panel current, a cost and power consumption of an OLED display device increases substantially due to the serial resistor.

SUMMARY

At least one exemplary embodiment of the disclosure provides an organic light emitting diode (OLED) display device capable of controlling a panel current without a serial resistor for sensing the panel current.

At least one exemplary embodiment of the disclosure provides a method of operating an OLED display device capable of controlling a panel current without a serial resistor for sensing the panel current.

According to an exemplary embodiment of the disclosure, there is provided an OLED display device with a display panel including a plurality of pixel rows, and a panel driver configured to drive the display panel. The panel driver includes a determining circuit configured to select one pixel row from the plurality of pixel rows, to determine load data based on input image data for the one pixel row, and to determine target mobility data corresponding to the load data, a sensing circuit configured to generate mobility sensing data corresponding to mobility values of driving transistors of a plurality of pixels included in the one pixel row by performing a mobility sensing operation on the one pixel row, and a current control circuit configured to compare the mobility sensing data and the target mobility data to generate a result, and to adjust a panel current flowing through the display panel according to the result.

In an exemplary embodiment, the determining circuit calculates a plurality of pixel row load data for the plurality of pixel rows based on the input image data for the plurality of pixel rows, and selects the one pixel row having largest pixel row load data among the plurality of pixel row load data of the plurality of pixel rows.

In an exemplary embodiment, the selected one pixel row is an uppermost pixel row or a lowermost pixel row among the plurality of pixel rows.

In an exemplary embodiment, the determining circuit sequentially selects the plurality of pixel rows such that the one pixel row is changed per frame period.

In an exemplary embodiment, the determining circuit calculates the load data by dividing the input image data for the one pixel row by maximum image data for the one pixel row.

In an exemplary embodiment, the determining circuit determines the target mobility data as maximum target mobility data corresponding to reference load data when the load data is greater than or equal to the reference load data.

In an exemplary embodiment, the determining circuit includes a memory device configured to store a plurality of target mobility values respectively corresponding to a plurality of load values, and determines the target mobility data corresponding to the load data by using the storage device.

In exemplary embodiment, the determining circuit determines two load values adjacent to a load value represented by the load data among the plurality of load values, obtains two target mobility values corresponding to the two load values among the plurality of target mobility values from the storage device, and interpolates the target mobility data from the two target mobility values.

In an exemplary embodiment, the plurality of target mobility values stored in the memory device is measured by using the sensing circuit before an aging process for the display panel is performed.

In an exemplary embodiment, in a sensing period of each frame period, the panel driver applies a reference voltage to the plurality of pixels included in the one pixel row, detects sensing voltage changes of a plurality of sensing lines coupled to the plurality of pixels during a sensing time within the sensing period by using the sensing circuit, and generates the mobility sensing data based on the sensing voltage changes.

In an exemplary embodiment, the current control circuit decreases the panel current when the mobility sensing data is greater than the target mobility data, and increases the panel current when the mobility sensing data is less than the target mobility data.

In an exemplary embodiment, when the mobility sensing data is greater than the target mobility data, the current control circuit generates output image data provided to a data driver included in the panel driver by decreasing the input image data for the plurality of pixel rows such that data voltages applied to the plurality of pixel rows are decreased. When the mobility sensing data is less than the target mobility data, the current control circuit generates the output image data provided to the data driver by increasing the input image data for the plurality of pixel rows such that the data voltages applied to the plurality of pixel rows are increased.

In an exemplary embodiment, the panel driver further includes an overcurrent protection circuit configured to stop an operation of the OLED display device when the mobility sensing data is greater by more than a shut down reference amount than the target mobility data during a plurality of frame periods corresponding to a shut down reference time.

According to an exemplary embodiment of the disclosure, there is provided a method of operating an OLED display device including a display panel having a plurality of pixel rows. In the method, one pixel row is selected from the plurality of pixel rows, load data is determined based on input image data for the one pixel row, target mobility data corresponding to the load data is determined, mobility sensing data corresponding to mobility values of driving transistors of a plurality of pixels included in the one pixel row are generated by performing a mobility sensing operation on the one pixel row, the mobility sensing data and the target mobility data are compared to generate a result, and a panel current flowing through the display panel is adjusted according to the result.

In an exemplary embodiment, to select the one pixel row, a plurality of pixel row load data for the plurality of pixel rows is calculated based on the input image data for the plurality of pixel rows, and the one pixel row having largest pixel row load data among the plurality of pixel row load data of the plurality of pixel rows is selected.

In an exemplary embodiment, to select the one pixel row, an uppermost pixel row or a lowermost pixel row among the plurality of pixel rows is selected.

In an exemplary embodiment, to select the one pixel row, the plurality of pixel rows is sequentially selected such that the one pixel row is changed per frame period.

In an exemplary embodiment, to adjust the panel current, the panel current is decreased when the mobility sensing data are greater than the target mobility data, and the panel current is increased when the mobility sensing data are less than the target mobility data.

In an exemplary embodiment, to decrease the panel current, data voltages applied to the plurality of pixel rows are decreased. To increase the panel current, the data voltages applied to the plurality of pixel rows are increased.

In an exemplary embodiment, an operation of the OLED display device is stopped when the mobility sensing data is greater by more than a shut down reference amount than the target mobility data during a plurality of frame periods corresponding to a shut down reference time.

According to an exemplary embodiment of the disclosure, an organic light emitting diode (OLED) display device is provided that includes a display panel and a panel driver. The display panel includes a plurality of pixel rows, a plurality of data lines, and plurality of sensing lines. Each pixel row includes a plurality of pixels and each pixel is connected to a corresponding one of the data lines and a corresponding one of the sensing lines. The panel driver is configured to drive the display panel. The panel driver is configured to output data voltages to the data lines during an active period of a frame period and sense sensing voltages from the sensing lines during a sensing period of the frame period. The panel driver is configured to determine a load data from the sensing voltages received from one of the pixel rows, determine mobility data from the load data, compare the mobility data with a target value to generate a result, and adjust panel current of the display panel based on the result.

In an embodiment, the panel driver includes a current control circuit configured to stop an operation of the OLED display device when the mobility data exceeds the target value for more than N frame periods, where N is at least one.

In an embodiment, the panel driver increases the panel current when the mobility data exceeds the target value and a temperature is greater than a threshold.

As described above, in an OLED display device and a method of operating the OLED display device according to at least one exemplary embodiment of the disclosure, one pixel row is selected from a plurality of pixel rows, load data is determined based on input image data for the selected one pixel row, target mobility data corresponding to the load data is determined, mobility sensing data is generated by performing a mobility sensing operation for the one pixel row, and a panel current is adjusted by comparing the mobility sensing data and the target mobility data. Accordingly, the OLED display device may control the panel current by using the mobility sensing data without a serial resistor for sensing the panel current, and thus a cost and power consumption of the OLED display device may be reduced.

Further, in the OLED display device and the method of operating the OLED display device according to at least one exemplary embodiment of the disclosure, an overcurrent protection operation may be performed using the mobility sensing data.

BRIEF DESCRIPTION OF THE DRAWINGS

Exemplary embodiments of the disclosure will be more clearly understood from the following detailed description in conjunction with the accompanying drawings.

DETAILED DESCRIPTION OF THE EXEMPLARY EMBODIMENTS

Hereinafter, exemplary embodiments of the present inventive concept will be explained in detail with reference to the accompanying drawings.

Figure 1:
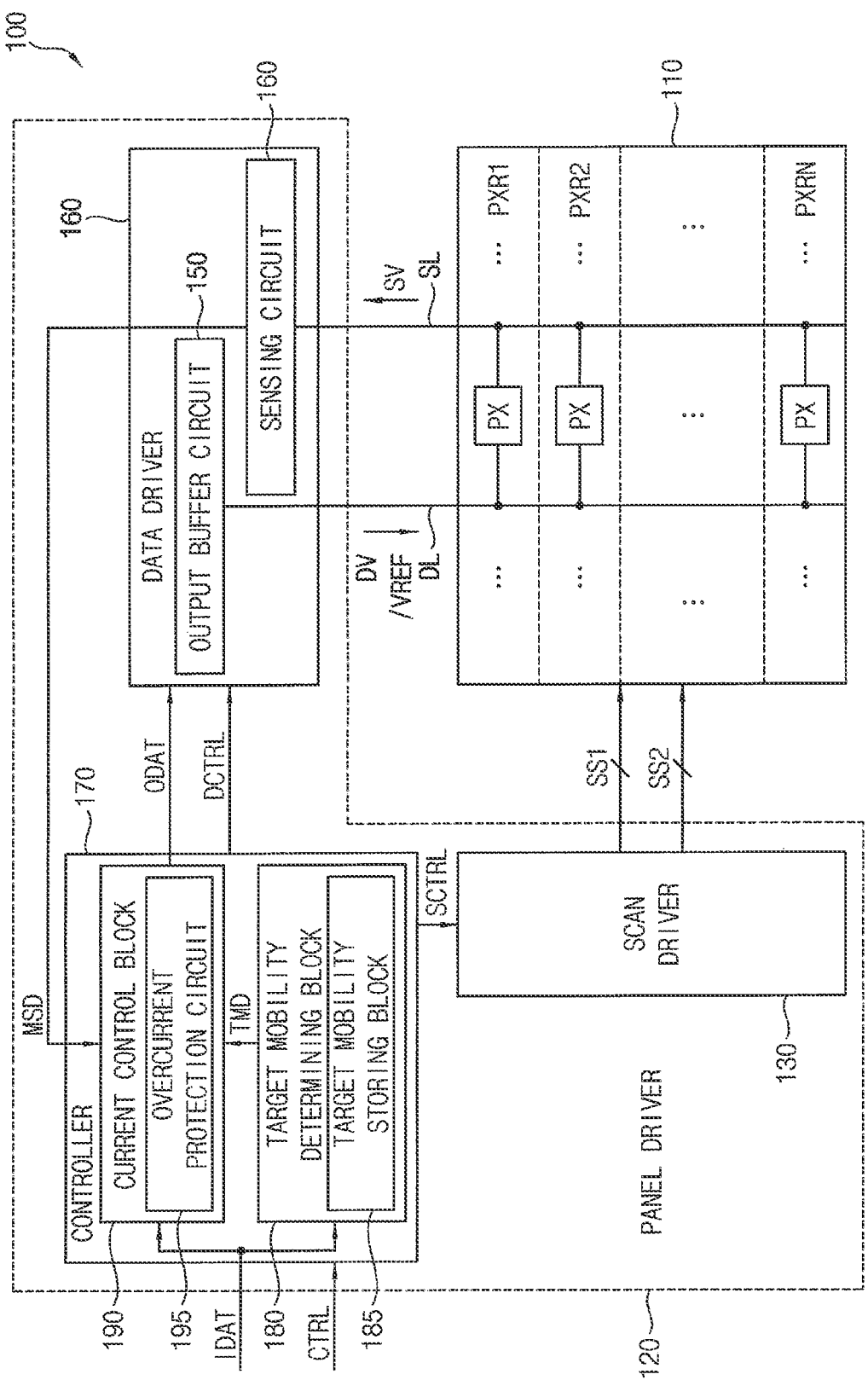
FIG. 1 is a block diagram illustrating an organic light emitting diode (OLED) display device according to an exemplary embodiment of the disclosure.
Figures 2, 3:
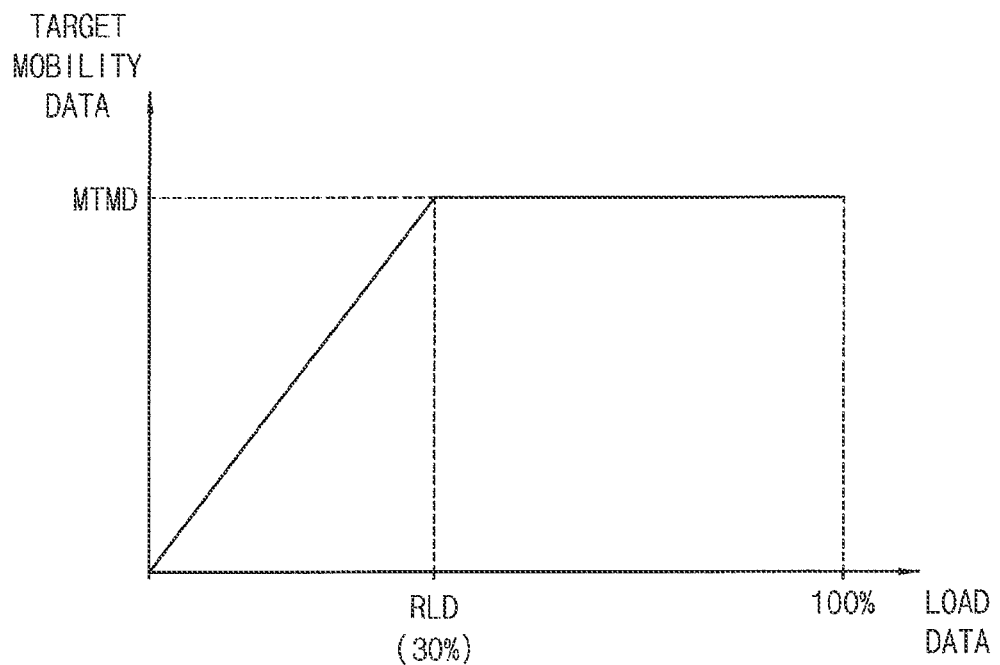
FIG. 2 is a diagram illustrating an example of target mobility data according to load data.
FIG. 3 is a diagram for describing an example of a target mobility storing block.
Figure 4:
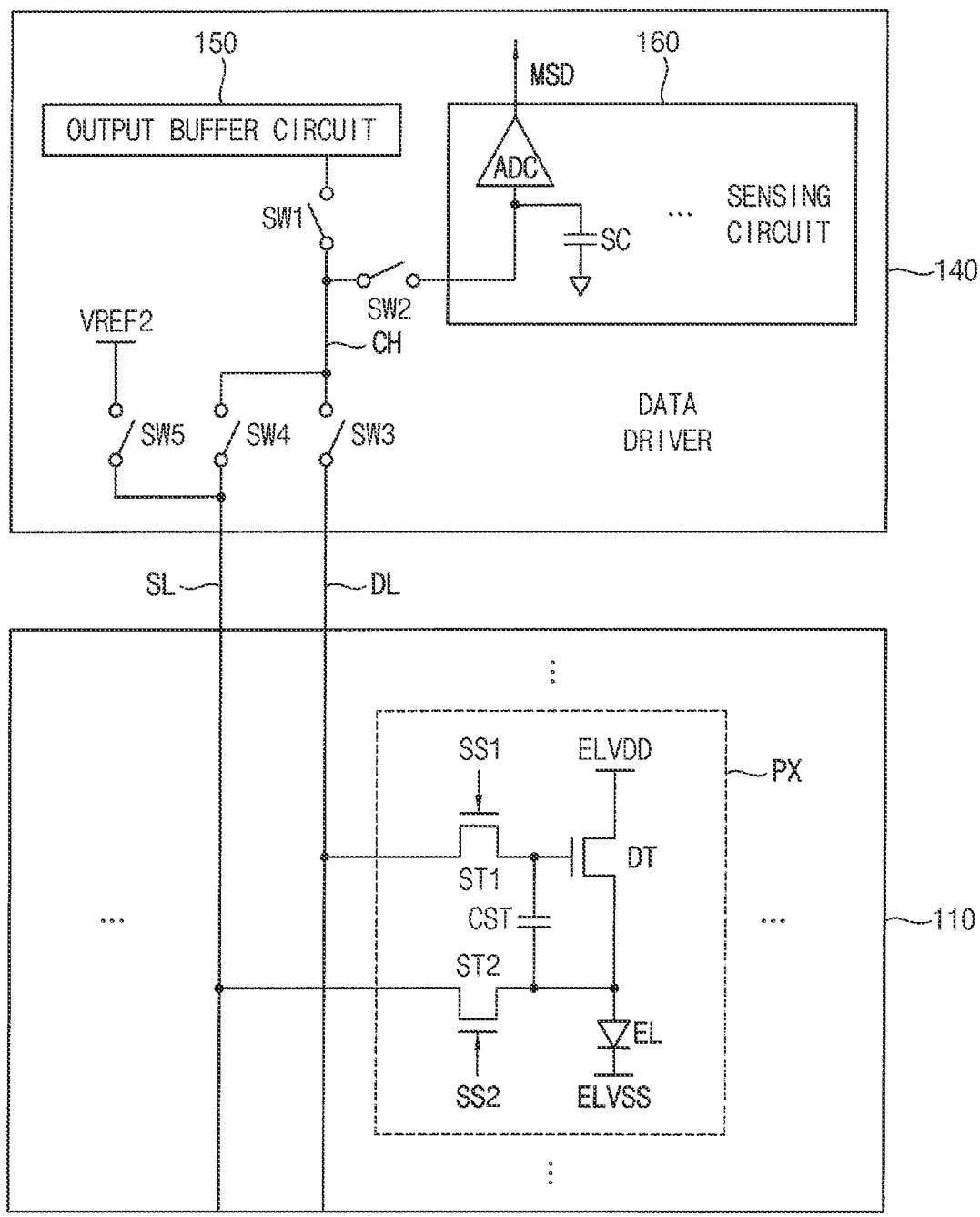
FIG. 4 is a diagram illustrating a data driver and a display panel for describing an example of a mobility sensing operation.
Figure 5:
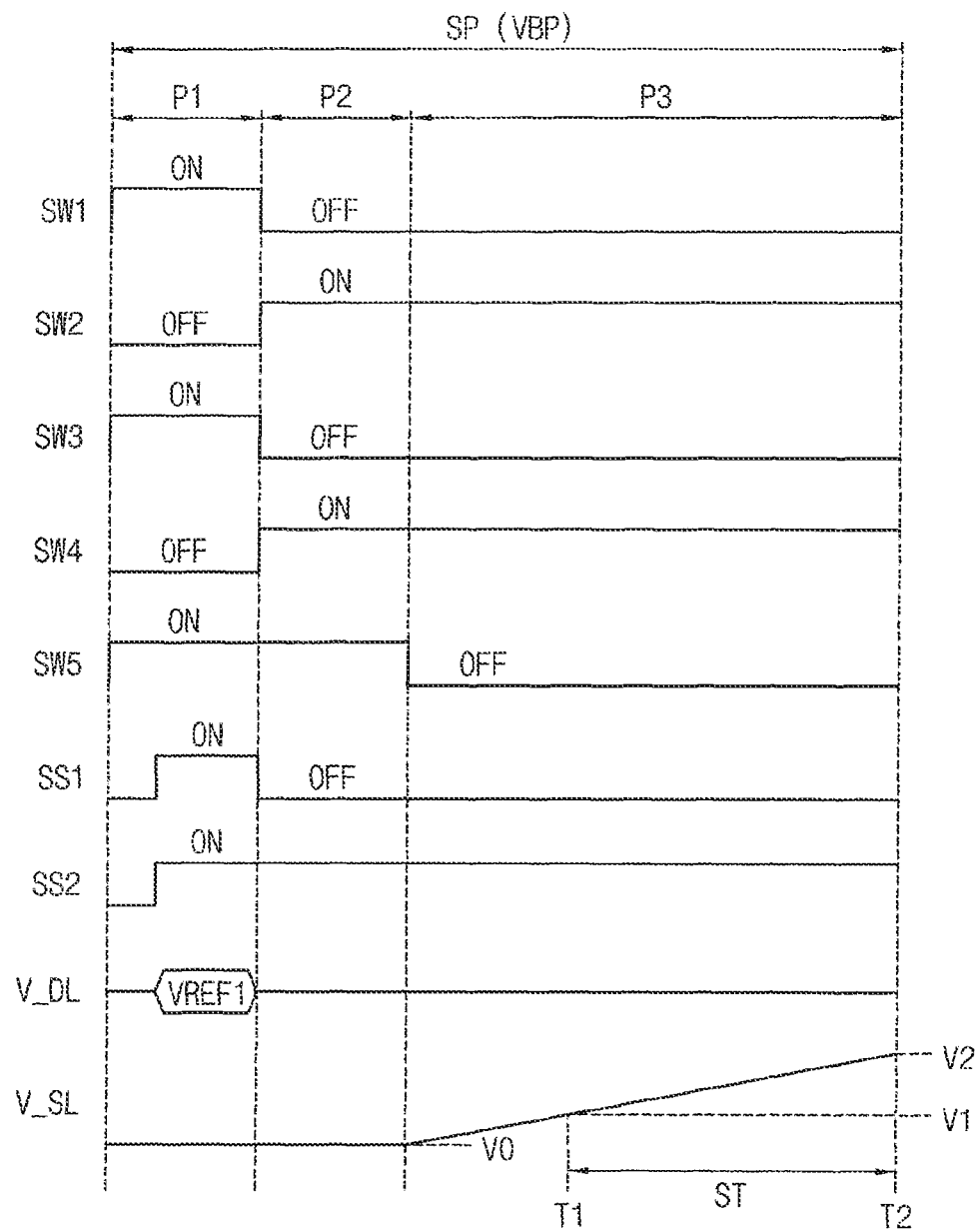
FIG. 5 is a timing diagram for describing an example of a mobility sensing operation.
Figure 6:
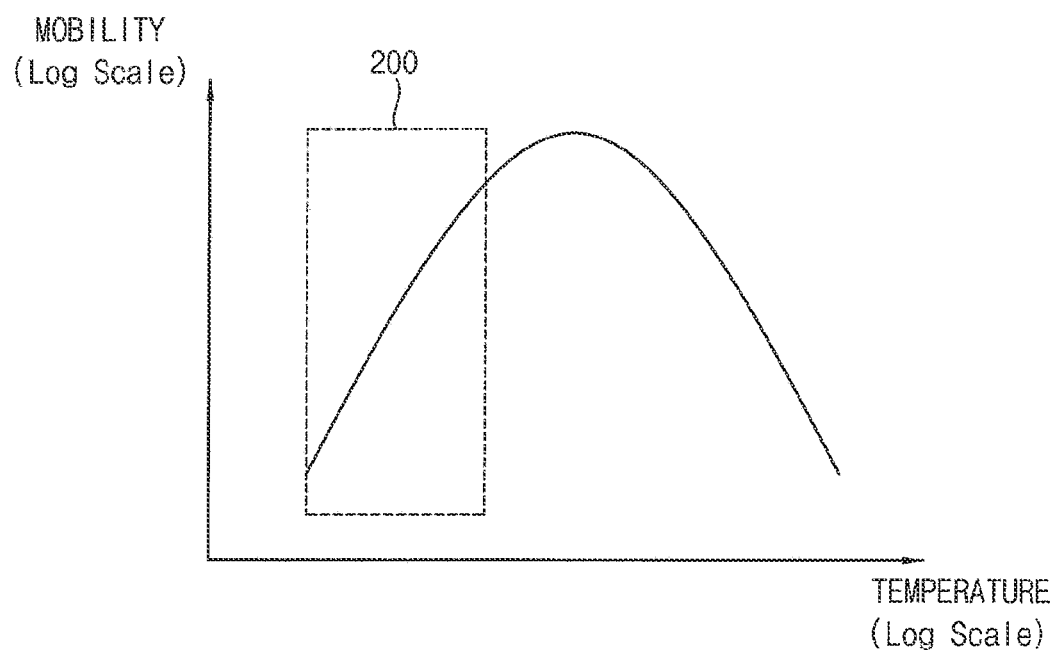
FIG. 6 is a diagram illustrating an example of mobility of a driving transistor according to a temperature.

FIG. 1 is a block diagram illustrating an organic light emitting diode (OLED) display device according to an exemplary embodiment of the disclosure, FIG. 2 is a diagram illustrating an example of target mobility data according to load data, FIG. 3 is a diagram for describing an example of a target mobility storing block (e.g., a storage device), FIG. 4 is a diagram illustrating a data driver and a display panel for describing an example of a mobility sensing operation, FIG. 5 is a timing diagram for describing an example of a mobility sensing operation, and FIG. 6 is a diagram illustrating an example of mobility of a driving transistor according to a temperature.

Referring to FIG. 1, an OLED display device 100 according to an exemplary embodiment of the disclosure includes a display panel 110 that includes a plurality of pixel rows (e.g., PXR1, PXR2, . . . , PXRN), and a panel driver 120 (e.g., a driver circuit) that drives the display panel 110. In an exemplary embodiment, the panel driver 120 includes a scan driver 130 (e.g., a driver circuit) that provides first scan signals SS1 and second scan signals SS2 to the plurality of pixel rows, a data driver 140 (e.g., a driver circuit) that provides data voltages DV to the plurality of pixel rows, a sensing circuit 160 that senses driving characteristics of driving transistors of the plurality of pixel rows, and a controller 170 (e.g., a control circuit) that controls an operation of the OLED display device 100.

The display panel 110 includes a plurality of pixel rows PXR1, PXR2, . . . , PXRN each including a plurality of pixels PX. In an exemplary embodiment, each pixel of a given pixel row receives the same first scan signal SS1 and the same second scan signal SS2. In an embodiment, the display panel 110 further includes a plurality of first scan lines (or gate lines) for transferring the first scan signals SS1, a plurality of second scan lines for transferring the second scan signals SS2, a plurality of data lines DL and a plurality of sensing lines SL. In an exemplary embodiment, each pixel PX includes an organic light emitting diode (OLED), and the display panel 110 is an OLED panel.

For example, as illustrated in FIG. 4, each pixel PX includes a storage capacitor CST, a first switching transistor ST1, a second switching transistor ST2, a driving transistor DT and an organic light emitting diode EL. The first switching transistor ST1 couples the data line DL to a first electrode of the storage capacitor CST in response to the first scan signal SS1, and the second switching transistor ST2 couples the sensing line SL to a second electrode of the storage capacitor CST in response to the second scan signal SS2. The storage capacitor CST may store the data voltage DV transferred through the data line DL and/or the sensing line SL. The driving transistor DT generates a driving current based on the data voltage DV stored in the storage capacitor CST. The organic light emitting diode EL emits light based on the driving current generated by the driving transistor DT. FIG. 4 illustrates the pixel PX of the OLED display device 100 according to an exemplary embodiment of the inventive concept. However, the pixel PX is not limited to the example shown in FIG. 4. For example, the pixel PX may include a different number of transistors from that shown in FIG. 4.

The scan driver 130 generate the first scan signals SS1 and the second scan signals SS2 based on a scan control signal SCTRL received from the controller 170. The scan driver 130 may sequentially provide the first scan signals SS1 to the plurality of pixels PX on a pixel row basis, and may sequentially provide the second scan signals SS2 to the plurality of pixels PX on the pixel row basis. In some exemplary embodiments, the scan control signal SCTRL includes a scan start signal and a scan clock signal, but is not limited thereto. In some exemplary embodiments, the scan driver 130 may be integrated or formed in a peripheral region of the display panel 110. In other exemplary embodiments, the scan driver 130 may be implemented with one or more integrated circuits.

The data driver 140 generates the data voltages DV based on output image data ODAT and a data control signal DCTRL received from the controller 170, and provides the data voltages DV to the plurality of pixels PX. In some exemplary embodiments, the data control signal DCTRL includes a horizontal start signal and a load signal, but is not limited thereto. In an exemplary embodiment, the data driver 140 includes an output buffer circuit 150 that outputs the data voltages DV to the data lines DL. In some exemplary embodiments, the output buffer circuit 150 provides the data voltages DV sequentially to the plurality of pixel rows PXR1, PXR2, . . . , PXRN through the data lines DL in an active period of a frame period, and provides a reference voltage VREF for a mobility sensing operation to a selected one of the plurality of pixel rows PXR1, PXR2, . . . , PXRN through the data lines DL in a vertical blank period or a sensing period of the frame period. In some exemplary embodiments, the data driver 140 may be implemented with one or more integrated circuits. In other exemplary embodiments, the data driver 140 and the controller 170 may be implemented with a single integrated circuit, and the single integrated circuit may be referred to as a timing controller embedded data driver (TED).

The sensing circuit 160 receives sensing voltages SV from the plurality of pixels PX through the plurality of sensing lines SL, and generates sensing data corresponding to the sensing voltages SV. In some exemplary embodiments, the sensing data includes mobility sensing data MSD corresponding to mobility values of the driving transistors DT of the plurality of pixels PX. Further, in some exemplary embodiments, the sensing data further includes threshold voltage sensing data representing threshold voltage values of the driving transistors DT of the plurality of pixels PX. For example, as illustrated in FIG. 4, with respect to each channel CH, the sensing circuit 160 includes a sensing capacitor SC coupled to the channel CH, and an analog-to-digital converter ADC for converting the sensing voltage SV to the sensing data. However, the sensing circuit 160 is not limited to the manner depicted in FIG. 4. In some exemplary embodiments, as illustrated in FIG. 1, the sensing circuit 160 is included in the data driver 140. However, the location of the sensing circuit 160 is not limited to the example of FIG. 1. For example, the sensing circuit 160 may be implemented with a separate integrated circuit, or may be included in the controller 170.

The controller 170 (e.g., a timing controller (TCON)) receives input image data IDAT and a control signal CTRL. The input image data and the control signal CTRL may be received from an external host (e.g., a graphic processing unit (GPU), a graphic card, etc.). In some exemplary embodiments, the control signal CTRL includes, a vertical synchronization signal, a horizontal synchronization signal, an input data enable signal, and a master clock signal, but is not limited thereto. The controller 170 generates the output image data ODAT, the data control signal DCTRL and the scan control signal SCTRL based on the input image data IDAT and the control signal CTRL. The controller 170 may control an operation of the data driver 140 by providing the output image data ODAT and the data control signal DCTRL to the data driver 140, and may control an operation of the scan driver 130 by providing the scan control signal SCTRL to the scan driver 130.

In the OLED display device 100 according to an exemplary embodiment of the disclosure, the panel driver 120 selects one pixel row from the plurality of pixel rows PXR1, PXR2, . . . , PXRN, determines load data based on the input image data IDAT for the selected one pixel row, determines target mobility data TMD corresponding to the load data, generates mobility sensing data MSD by performing a mobility sensing operation on the selected one pixel row, compares the mobility sensing data MSD and the target mobility data TMD, and may adjust a panel current flowing through the display panel 110 based on a result of the comparison. In an exemplary embodiment, the panel current is a sum of the driving currents flowing in the respective pixels PX due to a line receiving a first power supply voltage ELVDD and a line receiving a second power supply voltage ELVSS. However, the panel current is not limited to the sum and may be calculated in another manner. Thus, in the OLED display device 100 according to an exemplary embodiment of the disclosure, the panel driver 120 controls the panel current by using the mobility sensing data MSD without a serial resistor for sensing the panel current. In an exemplary embodiment of the disclosure, the panel driver 120 further includes a target mobility determining block 180 (e.g., a determining circuit) and a current control block 190 (e.g., current control circuit). In some exemplary embodiments, as illustrated in FIG. 1, the target mobility determining block 180 and the current control block 190 are included in the controller 170, but the locations of the target mobility determining block 180 and the current control block 190 are not limited to the example of FIG. 1.

In an embodiment, the target mobility determining block 180 selects one pixel row on which the mobility sensing operation is to be performed from the plurality of pixel rows PXR1, PXR2, . . . , PXRN. In some exemplary embodiments, as described below with reference to FIGS. 7 and 8, the target mobility determining block 180 calculates a plurality of pixel row load data for the plurality of pixel rows PXR1, PXR2, . . . , PXRN based on the input image data IDAT for the plurality of pixel rows PXR1, PXR2, . . . , PXRN, and selects the one pixel row having the largest pixel row load data among the plurality of pixel row load data of the plurality of pixel rows PXR1, PXR2, . . . , PXRN. In other exemplary embodiments, as described below with reference to FIGS. 9 and 10, the target mobility determining block 180 selects an uppermost pixel row PXR1 or a lowermost pixel row PXRN among the plurality of pixel rows PXR1, PXR2, . . . , PXRN. In still other exemplary embodiments, as described below with reference to FIGS. 11 and 12, the target mobility determining block 180 sequentially selects the plurality of pixel rows PXR1, PXR2, . . . , PXRN such that the one pixel row is changed per frame period. For example, the first pixel row PXR1 could be the selected pixel row during a first frame period, the second pixel row PXR2 could be the selected pixel row during a second frame period, etc.

In an embodiment, the target mobility determining block 180 determines load data based on the input image data IDAT for the selected one pixel row. In some exemplary embodiments, the target mobility determining block 180 calculates the load data by dividing the input image data IDAT for the selected one pixel row by the maximum image data for the selected one pixel row. For example, the load data may be calculated by an average or a sum of dividing pixel data included in the input image data IDAT for the one pixel row by an average or a sum of pixel data included in the maximum image data. Here, the maximum image data may be line image data (or image data for one pixel row) including the pixel data having the maximum gray level (e.g., a 255-gray level). For example, in a case where all the pixel data of the input image data IDAT for the selected one pixel row represents the maximum gray level, the target mobility determining block 180 generates the load data representing about 100% or exactly 100%. In another example, in a case where all the pixel data of the input image data IDAT for the selected one pixel row represent a middle gray level (e.g., a 128-gray level), the target mobility determining block 180 generates the load data representing about 50% or exactly 50%. In still another example, in a case where a half of the pixel data of the input image data IDAT for the selected one pixel row represents the maximum gray level, and the remaining half of the pixel data of the input image data IDAT for the selected one pixel row represents the minimum gray level (e.g., a 0-gray level), the target mobility determining block 180 generates the load data representing about 50% or exactly 50%. In an exemplary embodiment, the gray level of each pixel of a given pixel row are added together to generate a sum, the sum is divided by the number of pixels in the given pixel row to generate an average value, and the average value is divided by the maximum gray level to generate the load data of the given pixel row.

The target mobility determining block 180 determines the target mobility data TMD corresponding to the load data. In some exemplary embodiments, as illustrated in FIG. 2, the target mobility determining block 180 increases the target mobility data TMD as the load data increases in a case where the load data is less than reference load data RLD (e.g., representing about 30%). In an exemplary embodiment, the target mobility determining block 180 sets the target mobility data TMD to the maximum target mobility data MTMD corresponding to the reference load data RLD in a case where the load data is greater than or equal to the reference load data RLD. In this case, since the target mobility data TMD is limited to the maximum target mobility data MTMD, the panel current flowing through the display panel 110 is not excessively increased, and power consumption of the OLED display device 100 may be reduced.

In some exemplary embodiments, as illustrated in FIGS. 1 and 3, the target mobility determining block 180 includes a target mobility storing block 185 (e.g., a memory device) that stores a plurality of target mobility values TMD1, TMD2, TMD3, TMD4 and TMD5 respectively corresponding to a plurality of load values, for example about 1%, about 5%, about 10%, about 20%, and about 30%. The target mobility determining block 180 may determine the target mobility data TMD corresponding to the load data by using the target mobility storing block 185. For example, in a case where the load data represents the load value of about 10%, the target mobility determining block 180 may obtain the target mobility value TMD3 corresponding to the load data of about 10% from the target mobility storing block 185, and may generate the target mobility data TMD having the target mobility value TMD3. Further, in some exemplary embodiments, the target mobility determining block 180 determines two load values adjacent to a load value represented by the load data among the plurality of load values, obtains two target mobility values corresponding to the two load values among the plurality of target mobility values TMD1, TMD2, TMD3, TMD4 and TMD5 from the target mobility storing block 185, and interpolates the target mobility data TMD from the two target mobility values. For example, in a case where the load data represent the load value of about 15%, the target mobility determining block 180 obtains two target mobility values TMD2 and TMD3 corresponding to the two load values of about 10% and about 20% from the target mobility storing block 185, linearly interpolates an interpolated target mobility value from the two target mobility values TMD2 and TMD3, and generates the target mobility data TMD having the linearly interpolated target mobility value. Further, in some exemplary embodiments, an aging process that provides aging signals (e.g., including the scan signals SS1 and SS2 and the data voltages DV) to the display panel 110 to allow the plurality of pixels PX to emit light may be performed to improve stability and reliability of the OLED display device 100 before the OLED display device 100 is sold, and the plurality of target mobility values TMD1, TMD2, TMD3, TMD4 and TMD5 stored in the target mobility storing block 185 may be (e.g., averages or sums of) mobility values of the driving transistors DT included in any one pixel row measured by using the sensing circuit 160 before the aging process for the display panel 110 is performed. Thus, the plurality of target mobility values TMD1, TMD2, TMD3, TMD4 and TMD5 stored in the target mobility storing block 185 may correspond to initial mobility characteristics of the driving transistors DT, but is not limited thereto.

In an embodiment, the sensing circuit 160 generates the mobility sensing data MSD corresponding to (e.g., an average or a sum of) mobility values of the driving transistors DT of the plurality of pixels PX included in the selected one pixel row by performing the mobility sensing operation on the selected one pixel row. For example, as illustrated in FIGS. 4 and 5, with respect to each channel CH, the data driver 140 may further include a first switch SW1 for selectively coupling the output buffer circuit 150 and the channel CH, a second switch SW2 for selectively coupling the sensing circuit 160 and the channel CH, a third switch SW3 for selectively coupling the channel CH and the data line DL, a fourth switch SW4 for selectively coupling the channel CH and the sensing line SL, and a fifth switch SW5 for selectively coupling the sensing line SL and a line of a second reference voltage VREF2. To perform the mobility sensing operation on each pixel PX included in the selected one pixel row, the data driver 140 may provide, as the reference voltage VREF, a first reference voltage VREF1 and the second reference voltage VREF2 respectively to the first and second electrodes of the storage capacitor CST, and may detect a change of a voltage V_SL of the sensing line SL, or a change of the sensing voltage SV during a desired or predetermined sensing time ST by using the sensing circuit 160.

For example, as illustrated in FIG. 5, the mobility sensing operation for the selected one pixel row may be performed in a sensing period SP of each frame period. In some exemplary embodiments, the sensing period SP of each frame period corresponds to a vertical blank period VBP between active periods. In an embodiment, the sensing period SP includes a first period P1 in which the reference voltage VREF is applied to the plurality of pixels PX included in the selected one pixel row, a second period P2 in which the plurality of pixels PX is coupled to the sensing circuit 160 through the plurality of sensing lines SL, and a third period P3 including the sensing time ST in which the mobility characteristics of the driving transistors DT of the plurality of pixels PX is sensed. In an embodiment, the third period P3 is longer than the first period P1 or the second period P2. In an embodiment, the third period P3 is longer than a sum of the first and second periods P1 and P2.

In the first period P1, the first switch SW1 is turned on, the second switch SW2 is turned off, the third switch SW3 is turned on, the fourth switch SW4 is turned off, and the fifth switch SW5 is turned on. Thus, each channel CH may be coupled to the output buffer circuit 150 and the data line DL, and the second reference voltage VREF2 may be applied to the sensing line SL. Further, the first scan signal SS1 having an on level may be applied, the second scan signal SS2 having an on level may be applied, and the output buffer circuit 150 may output the first reference voltage VREF1 as a voltage V_DL of the data line DL. Accordingly, the first switching transistor ST1 is turned on, and the first reference voltage VREF1 is applied to the first electrode of the storage capacitor CST. Further, the second switching transistor ST2 is turned on, and the second reference voltage VREF2 is applied to the second electrode of the storage capacitor CST. Thus, the storage capacitor CST stores, as the reference voltage VREF, a voltage difference between the first reference voltage VREF1 and the second reference voltage VREF2.

In the second period P2, the first switch SW1 is turned off, the second switch SW2 is turned on, the third switch SW3 is turned off, the fourth switch SW4 is turned on, and the fifth switch SW5 is maintained in a turned-on state. Thus, each channel CH may be coupled to the sensing circuit 160 and the sensing line SL.

In the third period P3, the fifth switch SW5 is turned off. Accordingly, the second reference voltage VREF2 is not applied to the sensing line SL, and the voltage V_SL of the sensing line SL, or the sensing voltage SV is gradually increased by the turned-on driving transistor DT from an initial voltage V0 to a second voltage V2 based on the voltage difference between the first reference voltage VREF1 and the second reference voltage VREF2 stored in the storage capacitor CST. In an embodiment, the initial voltage V0 corresponds to the second reference voltage VREF2, and the second voltage V2 is a voltage lower than the first reference voltage VREF1. In an example, the first reference voltage VREF1 is about 5V, and second reference voltage VREF2 is about 2V. However, the first and second reference voltages VREF1 and VREF2 are not limited to these values. The sensing circuit 160 may detect the change of the voltage V_SL of the sensing line SL, or the change of the sensing voltage SV during the sensing time ST. For example, the sensing circuit 160 may measure a first voltage V1 as the voltage V_SL of the sensing line SL at a first time point T1, may measure the second voltage V2 as the voltage V_SL of the sensing line SL at a second time point T2 after the sensing time ST from the first time point T1, and may generate the mobility sensing data MSD based on the change of the sensing voltage SV, or a voltage difference between the first voltage V1 and the second voltage V2. In some exemplary embodiments, the sensing circuit 160 generates the mobility sensing data MSD by using the following Equation 1, $$I = C^* (V2-V1)/(T2-T1) \qquad \text{(Equation 1).}$$

In Equation 1, V1 is the first voltage, V2 is the second voltage, T1 is the first time point, T2 is the second time point, C is a capacitance of the sensing capacitor SC (and a parasitic capacitor of the sensing line SL), and I is a current of the sensing line SL. The current I of the sensing line SL may correspond to mobility of the driving transistor DT, and thus the sensing circuit 160 may generate the mobility sensing data MSD representing the current I of the sensing line SL calculated using above Equation 1.

In an exemplary embodiment, in the sensing period SP of each frame period, the panel driver 120 applies the reference voltage VREF to the plurality of pixels PX included in the selected one pixel row, detects the sensing voltage changes of the plurality of sensing lines SL coupled to the plurality of pixels PX during the sensing time ST within the sensing period SP by using the sensing circuit 160, and generates the mobility sensing data MSD based on the sensing voltage changes. Although FIG. 4 illustrates an example of each pixel PX of the display panel 100 and the data driver 140 performing the mobility sensing operation, configurations of the data driver 140 and the pixel PX according to exemplary embodiments are not limited to the example of FIG. 4. Further, although FIG. 5 illustrates an example of timings of switches, signals and voltages for describing the mobility sensing operation, the mobility sensing operation of the OLED display device 100 according to exemplary embodiments is not limited to the example of FIG. 5.

Referring again to FIG. 1, the current control block 190 compares the mobility sensing data MSD and the target mobility data TMD, and may adjust the panel current flowing through the display panel 110 according to a result of the comparison of the mobility sensing data MSD and the target mobility data TMD. In an exemplary embodiment, the current control block 190 decreases the panel current when the mobility sensing data MSD is greater than the target mobility data TMD, and increases the panel current when the mobility sensing data MSD is less than the target mobility data TMD. In some exemplary embodiments, in a case where the mobility sensing data MSD is greater than the target mobility data TMD, the current control block 190 may generate the output image data ODAT provided to the data driver 140 by decreasing the input image data IDAT for the plurality of pixel rows PXR1, PXR2, ... , PXRN such that the data voltages DV applied to the plurality of pixel rows PXR1, PXR2, ... , PXRN are decreased. For example, the current control block 190 may generate the output image data ODAT by multiplying pixel data included in the input image data IDAT by a coefficient less than 1. For example, the coefficient may be a value greater than 0 and less than 1. Accordingly, the data voltages DV applied to the plurality of pixels PX may be decreased based on the output image data ODAT generated by decreasing the input image data IDAT, and the driving currents of the driving transistors DT of the plurality of pixels PX, or the panel current may be decreased based on the decreased data voltages DV. Further, in a case where the mobility sensing data MSD is less than the target mobility data TMD, the current control block 190 may generate the output image data ODAT provided to the data driver 140 by increasing the input image data IDAT for the plurality of pixel rows PXR1, PXR2, ... , PXRN such that the data voltages DV applied to the plurality of pixel rows PXR1, PXR2, ... , PXRN are increased. For example, the current control block 190 may generate the output image data ODAT by multiplying the pixel data included in the input image data IDAT by a coefficient greater than 1. Accordingly, the data voltages DV applied to the plurality of pixels PX may be increased based on the output image data ODAT generated by increasing the input image data IDAT, and the driving currents of the driving transistors DT of the plurality of pixels PX, or the panel current may be increased based on the increased data voltages DV.

If a temperature of the display panel 110 is increased, luminance of the display panel 110, or the panel current may be increased. Further, if the luminance of the display panel 110 or the panel current is increased, the temperature of the display panel 110 may be increased. Thus, the luminance of the display panel 110 or the panel current may be proportional to the temperature of the display panel 110. FIG. 6 illustrates an example of mobility (in a log scale) of each driving transistor DT according to the temperature (in a log scale) of the display panel 110. As illustrated in (e.g., a left half of) FIG. 6, in an impurity scattering region 200 having a relatively low temperature, the mobility of the driving transistor DT increases as the temperature of the display panel 110 increases. Thus, not only the panel current, but also the mobility of the driving transistor DT may be proportional to the temperature of the display panel 110, and thus the mobility of the driving transistor DT may be proportional to the panel current. Accordingly, in the OLED display device 100 according to an exemplary embodiment of the disclosure, even though a present panel current is not directly sensed using a serial resistor coupled to the display panel 110, the present panel current may be inferred from the mobility sensing data MSD representing the mobility of the driving transistor DT. Further, to allow the mobility sensing data MSD corresponding to the present panel current to become the target mobility data TMD corresponding to a target panel current, the OLED display device 100 may adjust the panel current by adjusting the data voltages DV. Accordingly, the OLED display device 100 may control the panel current to be substantially constant with respect to substantially the same load data. Thus, the OLED display device 100 may perform a constant current control operation without the serial resistor. However, as illustrated in (e.g., a right half of) FIG. 6, in a lattice scattering region having a relatively high temperature, the mobility of the driving transistor DT decreases as the temperature of the display panel 110 increases. In an exemplary embodiment of the disclosure, in a case where the driving transistors DT of the display panel 110 have a mobility characteristic in the lattice scattering region, the panel driver 120 increases the panel current when the mobility sensing data MSD is greater than the target mobility data TMD, and decreases the panel current when the mobility sensing data MSD is less than the target mobility data TMD.

The constant current control operation may be performed by sensing the present panel current using a serial resistor coupled to the display panel 110. The panel current may be controlled by comparing the present panel current and a constant target panel current. However, in this case, the serial resistor having a high resistance is required to sense the panel current, and thus a manufacturing the OLED display device may be increased. Further, power consumption of the OLED display device may be increased by the serial resistor. However, as described above, in the OLED display device 100 according to an exemplary embodiment of the disclosure, the panel current is controlled by using the mobility sensing data MSD without the serial resistor for sensing the panel current, and thus the cost and the power consumption of the OLED display device 100 may be reduced.

In an exemplary embodiment of the disclosure, the panel driver 120 further includes an overcurrent protection circuit 195 for detecting an overcurrent of the display panel 110 and for stopping an operation of the OLED display device 100. In an embodiment, the overcurrent protection circuit 195 determines that the overcurrent occurs in the display panel 110 in a case where the mobility sensing data MSD is greater by more than a shut down reference amount than the target mobility data TMD during a plurality of frame periods (e.g., 60 frame periods) corresponding to a shut down reference time, and stops the operation of the OLED display device 100. For example, if the overcurrent protection circuit 195 determines that the mobility sensing data MSD exceeds a target amount by more than the reference amount for a certain number of frame periods, the current control block 190, the controller 170, or the panel driver 120 may perform an operation to reduce the overcurrent. For example, the operation may include the controller 170 no longer outputting the output image data ODAT; the controller 170 providing a scan control signal SCTRL that informs the scan driver 130 not to activate any scan signals; or the panel driver 120 blocking power to the data driver 160, the scan driver 130, and/or the display panel 110. In some exemplary embodiments, as illustrated in FIG. 1, the overcurrent protection circuit 195 may be included in the controller 170 or the current control block 190, but the location of the overcurrent protection circuit 195 is not limited to the example of FIG. 1.

When the serial resistor is included in the OLED display device, the overcurrent is determined to occur when the present panel current sensed using the serial resistor is greater than a reference panel current that is constant regardless of the load data. However, when the serial resistor is used in a case where the load data represents a low load, the overcurrent may not be detected. However, in the OLED display device 100 according to an exemplary embodiment of the disclosure, since the overcurrent is detected by using the mobility sensing data MSD and the target mobility data TMD corresponding to the load data, the overcurrent may be accurately detected even if the load data represents the low load.

As described above, in the OLED display device 100 according to an exemplary embodiment of the disclosure, the panel driver 120 selects one pixel row from the plurality of pixel rows PXR1, PXR2, ..., PXRN, determines the load data based on the input image data IDAT for the selected one pixel row, determines the target mobility data TMD corresponding to the load data, generates the mobility sensing data MSD by performing the mobility sensing operation on the selected one pixel row, and adjusts the panel current by comparing the mobility sensing data MSD and the target mobility data TMD. Accordingly, in the OLED display device 100 according to an exemplary embodiment of the disclosure, the panel driver 120 controls the panel current by using the mobility sensing data MSD without the serial resistor for sensing the panel current, and thus the cost and the power consumption of the OLED display device 100 may be reduced. Further, in the OLED display device 100 according to an exemplary embodiment of the disclosure, the panel driver 120 performs an overcurrent protection operation by using the mobility sensing data MSD. Accordingly, in the OLED display device 100 according to an exemplary embodiment of the disclosure, the overcurrent protection operation may be performed normally even if the load data represents the low load.

Figure 7:
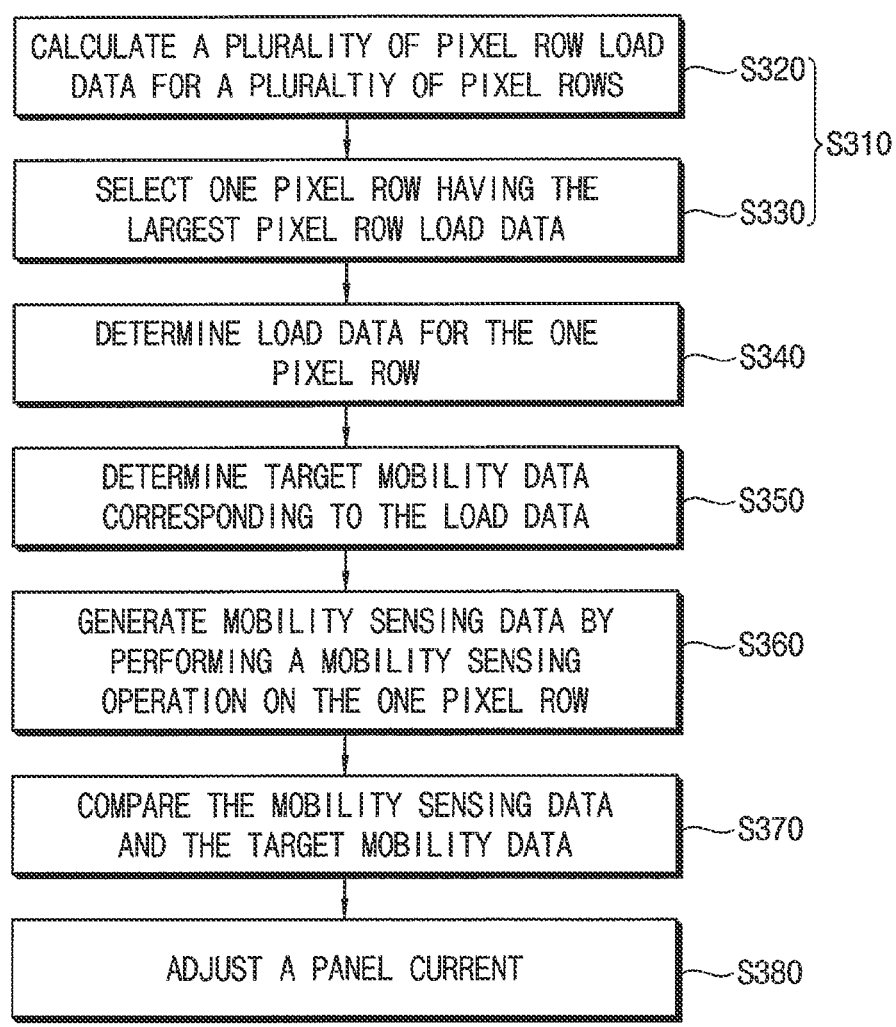
FIG. 7 is a flowchart illustrating a method of operating an OLED display device according to an exemplary embodiment of the disclosure.
Figure 8:
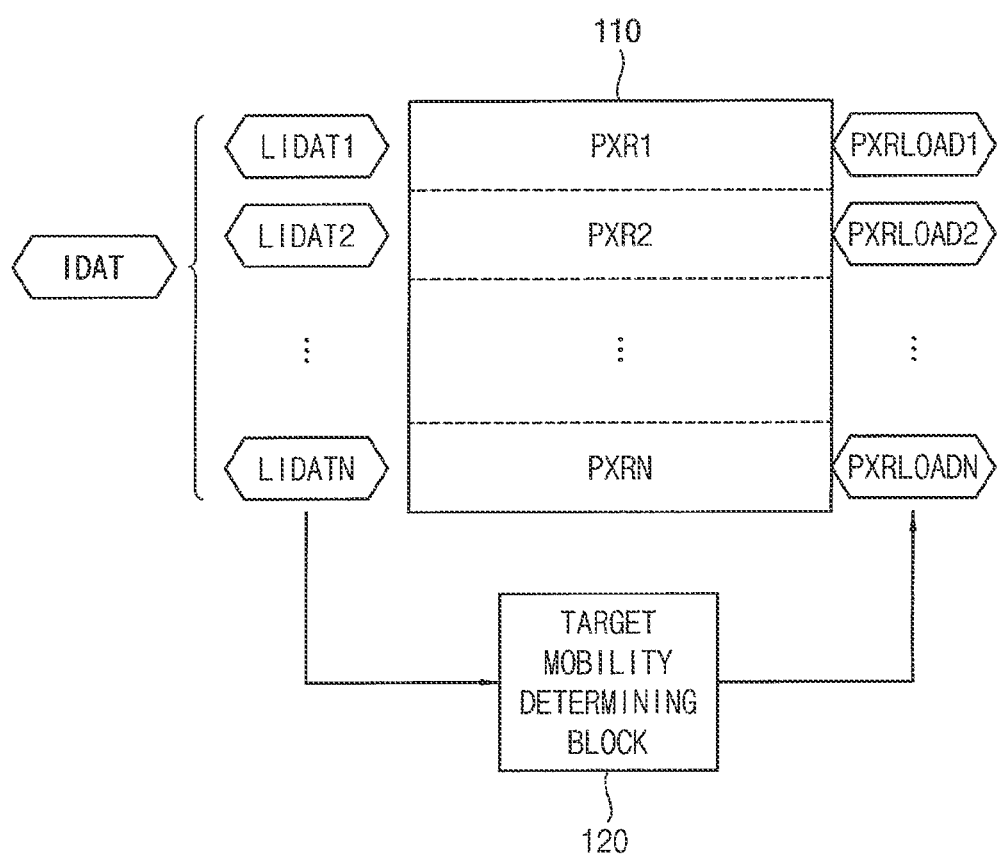
FIG. 8 is a diagram for describing an example where one pixel row on which a mobility sensing operation is performed is selected in a method of FIG. 7.

FIG. 7 is a flowchart illustrating a method of operating an OLED display device according to an exemplary embodiment of the disclosure, and FIG. 8 is a diagram for describing an example where one pixel row on which a mobility sensing operation is performed is selected in a method of FIG. 7.

Referring to FIGS. 1 and 7, in a method of operating an OLED display device 100 including a display panel 110 having a plurality of pixel rows PXR1, PXR2, ..., PXRN, a target mobility determining block 180 selects one pixel row from the plurality of pixel rows PXR1, PXR2, ..., PXRN (S310). In an exemplary embodiment, the target mobility determining block 180 calculates a plurality of pixel row load data for the plurality of pixel rows PXR1, PXR2, ..., PXRN based on input image data IDAT for the plurality of pixel rows PXR1, PXR2, ..., PXRN (S320), and selects the one pixel row having a largest pixel row load data among the plurality of pixel row load data of the plurality of pixel rows PXR1, PXR2, ..., PXRN (S330). For example, the determining block 180 may calculate a first load value for the first pixel row PXR1 from input image data of only the first pixel row PXR1, calculate a second load value for the second pixel row PXR2 from input image data of only the second pixel row PXR2, and select the first pixel row PXR1 if the first load value is higher than the second load value and all of the other load values calculated for the remaining pixel rows.

For example, as illustrated in FIG. 8, the input image data IDAT corresponding to one frame period may include a plurality of line image data LIDAT1, LIDAT2, ..., LIDATN for the plurality of pixel rows PXR1, PXR2, ..., PXRN, and the target mobility determining block 180 may calculate the plurality of pixel row load data PXRLOAD1, PXRLOAD2, ..., PXRLOADN for the plurality of pixel rows PXR1, PXR2, ..., PXRN based on the plurality of line image data LIDAT1, LIDAT2, ..., LIDATN for the plurality of pixel rows PXR1, PXR2, ..., PXRN, respectively. For example, the target mobility determining block 180 may calculate each pixel row load data (e.g., PXRLOAD1) by dividing an average or a sum of pixel data included in corresponding line image data (e.g., LIDAT1) by an average of a sum of the maximum image data for one pixel row, or the maximum line image data. Further, the target mobility determining block 180 may determine largest pixel row load data among the plurality of pixel row load data PXRLOAD1, PXRLOAD2, ..., PXRLOADN, and may select the one pixel row having the largest pixel row load data among the plurality of pixel rows PXR1, PXR2, ..., PXRN.

The target mobility determining block 180 may determine load data based on the input image data IDAT for the selected one pixel row (S340). For example, since the one pixel row having the largest pixel row load data is selected, the target mobility determining block 180 may determine, as the load data, the largest pixel row load data among the plurality of pixel row load data PXRLOAD1, PXRLOAD2, ..., PXRLOADN.

The target mobility determining block 180 determines target mobility data TMD corresponding to the load data (S350). In an exemplary embodiment, the target mobility data TMD determined by the target mobility determining block 180 increases as the load data increases in a case where the load data is less than reference load data, and is determined as the maximum target mobility data corresponding to the reference load data in a case where the load data is greater than or equal to the reference load data.

A sensing circuit 160 generates mobility sensing data MSD corresponding to mobility values of driving transistors of a plurality of pixels included in the selected one pixel row by performing a mobility sensing operation on the selected one pixel row (S360).

A current control block 190 compares the mobility sensing data MSD and the target mobility data TMD (S370), and may adjust a panel current flowing through the display panel 110 according to a result of the comparison of the mobility sensing data MSD and the target mobility data TMD (S380). In an exemplary embodiment of the disclosure, the current control block 190 decreases the panel current when the mobility sensing data MSD is greater than the target mobility data TMD, and increases the panel current when the mobility sensing data MSD is less than the target mobility data TMD. For example, to decrease the panel current, the current control block 190 may generate output image data ODAT by decreasing a magnitude of the input image data IDAT, and data voltages DV applied to the plurality of pixel rows PXR1, PXR2, . . . , PXRN are decreased based on the output image data ODAT. Further, to increase the panel current, the current control block 190 may generate the output image data ODAT by increasing a magnitude of the input image data IDAT, and the data voltages DV applied to the plurality of pixel rows PXR1, PXR2, . . . , PXRN may be increased based on the output image data ODAT. Accordingly, in a method of operating the OLED display device 100 according to an exemplary embodiment of the disclosure, the panel current may be controlled by using the mobility sensing data MSD without a serial resistor for sensing the panel current, and thus a cost and power consumption of the OLED display device 100 may be reduced.

Figure 9:
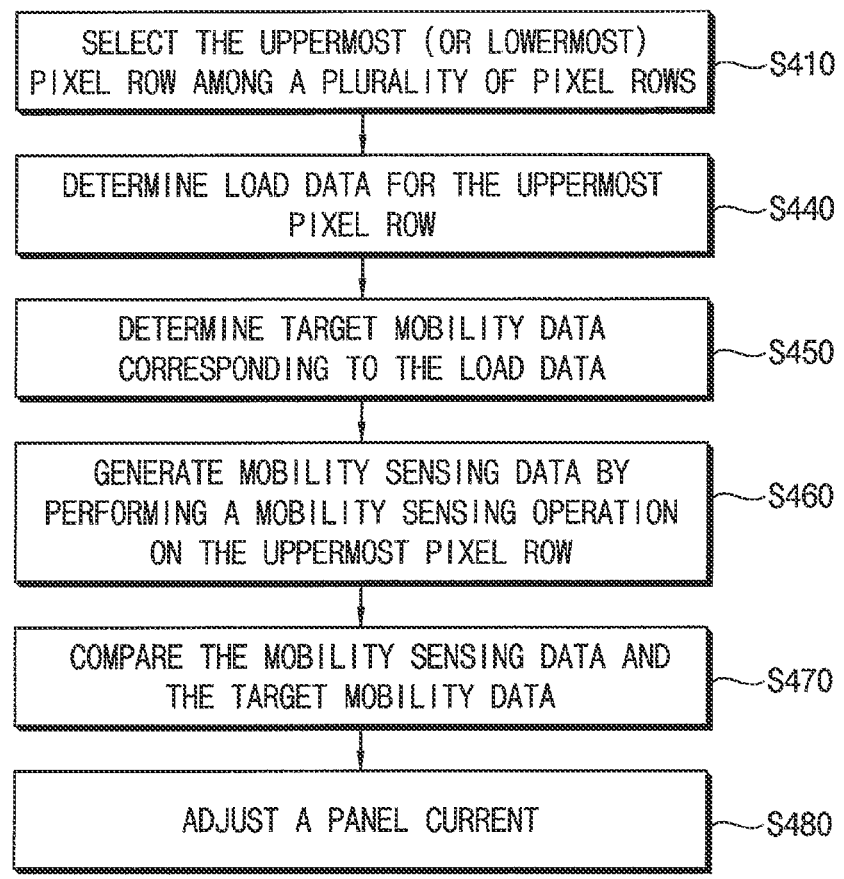
FIG. 9 is a flowchart illustrating a method of operating an OLED display device according to an exemplary embodiment of the disclosure.
Figure 10:
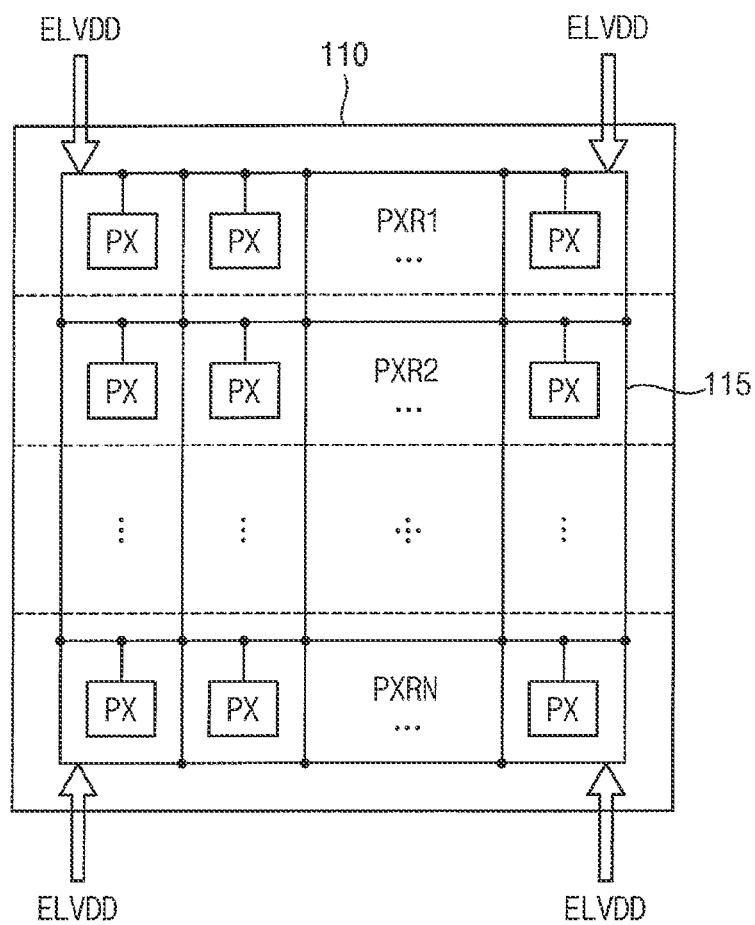
FIG. 10 is a diagram for describing an example where one pixel row on which a mobility sensing operation is performed is selected in a method of FIG. 9.

FIG. 9 is a flowchart illustrating a method of operating an OLED display device according to an exemplary embodiment of the disclosure, and FIG. 10 is a diagram for describing an example where one pixel row on which a mobility sensing operation is performed is selected in a method of FIG. 9.

Referring to FIGS. 1 and 9, in a method of operating an OLED display device 100 including a display panel 110 having a plurality of pixel rows PXR1, PXR2, . . . , PXRN, a target mobility determining block 180 selects an uppermost pixel row PXR1 (or a lowermost pixel row PXRN) from the plurality of pixel rows PXR1, PXR2, . . . , PXRN (S410). In some exemplary embodiments, as illustrated in FIG. 10, the display panel 110 includes a power wiring 115 having a mesh structure for providing a first power supply voltage ELVDD (e.g., a high power supply voltage) to a plurality of pixels PX. The power wiring 115 is supplied with the first power supply voltage ELVDD at an upper portion and/or a lower portion. Thus, a temperature change and/or a panel current change of the uppermost pixel row PXR1 (or the lowermost pixel row PXRN) located corresponding to the upper portion (or the lower portion) of the power wiring 115 may be greater than those of the other pixel rows (e.g., PXR2, . . . , etc.). Thus the target mobility determining block 180 may select the uppermost pixel row PXR1 (or the lowermost pixel row PXRN) having the greatest temperature change and/or the greatest panel current change as the one pixel row on which a mobility sensing operation is to be performed.

The target mobility determining block 180 determines load data based on the input image data IDAT for the uppermost pixel row PXR1 (S440), and determines target mobility data TMD corresponding to the load data (S450). A sensing circuit 160 generates mobility sensing data MSD by performing the mobility sensing operation on the uppermost pixel row PXR1 (S460). A current control block 190 compares the mobility sensing data MSD and the target mobility data TMD (S470), and may adjust a panel current flowing through the display panel 110 according to a result of the comparison of the mobility sensing data MSD and the target mobility data TMD (S480). Accordingly, in the method of operating the OLED display device 100 according to an exemplary embodiment of the disclosure, the panel current may be controlled by using the mobility sensing data MSD without a serial resistor for sensing the panel current, and thus a cost and power consumption of the OLED display device 100 may be reduced.

Figure 11:
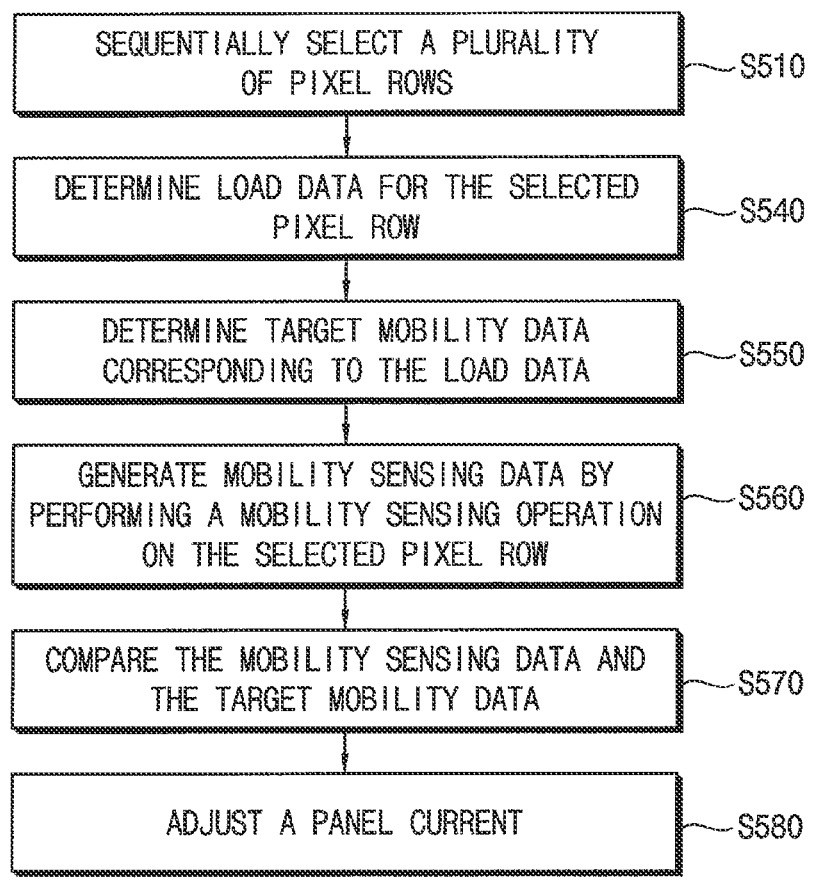
FIG. 11 is a flowchart illustrating a method of operating an OLED display device according to an exemplary embodiment of the disclosure.
Figure 12:
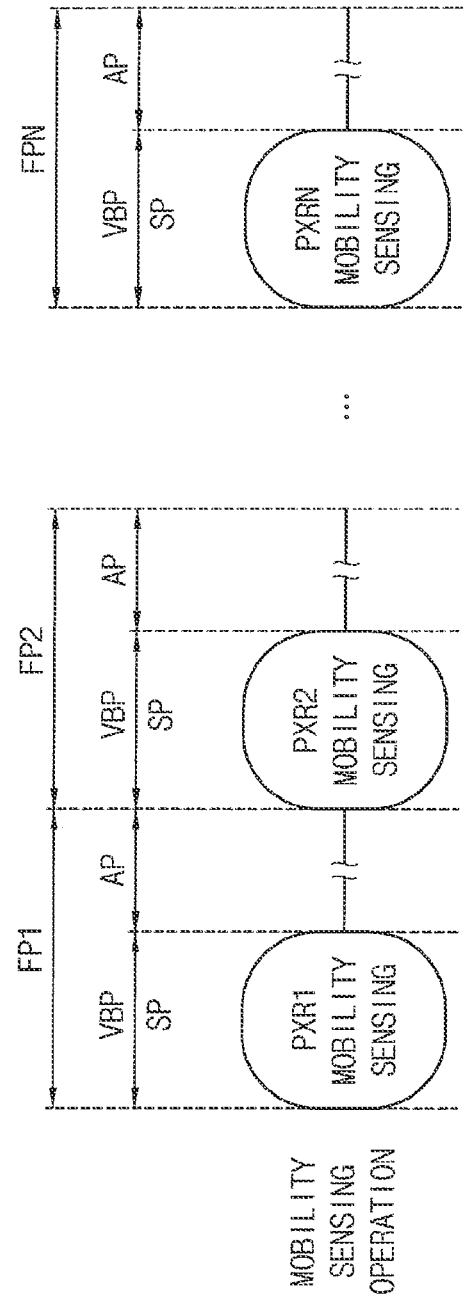
FIG. 12 is a diagram for describing an example where one pixel row on which a mobility sensing operation is performed is selected in a method of FIG. 11.

FIG. 11 is a flowchart illustrating a method of operating an OLED display device according to an exemplary embodiment of the disclosure, and FIG. 12 is a diagram for describing an example where one pixel row on which a mobility sensing operation is performed is selected in a method of FIG. 11.

Referring to FIGS. 1 and 11, in a method of operating an OLED display device 100 including a display panel 110 having a plurality of pixel rows PXR1, PXR2, . . . , PXRN, a target mobility determining block 180 sequentially selects the plurality of pixel rows PXR1, PXR2, . . . , PXRN such that one pixel row on which a mobility sensing operation is to be performed is changed per frame period (S510). For example, as illustrated in FIG. 12, each frame period FP1, FP2, . . . , FPN may include a vertical blank period VBP and an active period AP, and a panel driver 120 may perform the mobility sensing operation on one pixel row during a sensing period SP corresponding to the vertical blank period VBP. In an embodiment, all pixel rows of the display panel 110 sequentially receive corresponding data voltages during a single frame period. For example, during part of the frame period, only some of the pixel rows receive data voltages. In an embodiment, a given pixel row receives a data voltage during the active period of a frame period and does not receive a data voltage during the vertical blank period of the frame period. Further, the panel driver 120 may perform the mobility sensing operation on a first pixel row PXR1 in a sensing period SP of a first frame period FP1, and may perform the mobility sensing operation on a second pixel row PXR2 in a sensing period SP of a second frame period FP2. In this manner, the panel driver 120 may perform the mobility sensing operation on an N-th pixel row PXRN in a sensing period SP of an N-th frame period FPN, where N is an integer greater than 1. Thus, the target mobility determining block 180 may respectively select N pixel rows PXR1, PXR2, . . . , PXRN in N frame periods FP1, FP2, . . . , FPN. In an (N+1)-th frame period, the first pixel row PXR1 may be selected again.

The target mobility determining block 180 determines load data based on input image data IDAT for the selected one pixel row (S540), and determines target mobility data TMD corresponding to the load data (S550). A sensing circuit 160 generates mobility sensing data MSD by performing the mobility sensing operation on the selected one pixel row (S560). A current control block 190 compares the mobility sensing data MSD and the target mobility data TMD (S570), and may adjust a panel current flowing through the display panel 110 according to a result of the comparison of the mobility sensing data MSD and the target mobility data TMD (S580). In an exemplary embodiment, based on the result of the comparison in each frame period (e.g., FP1), the current control block 190 adjusts the panel current in the next frame period (e.g., FP2). For example, the comparison of a prior frame period may be used to adjust the panel current in the next frame period. In an exemplary embodiment, based on a sum of the results of the comparison in the N frame periods FP1, FP2, . . . , FPN, the current control block 190 adjusts the panel current in the next frame period, or in an (N+1)-th frame period. For example, if N=2, a first comparison is performed during the first frame period FP1 for the first pixel row, a second comparison is performed during the second frame period FP2 for the second pixel row, and a sum of results of the first and second comparisons is used to adjust the panel current during a third frame period. Further, based on a sum of the results of the comparison in the second through (N+1)-th frame periods, the current control block 190 may adjust the panel current in an (N+2)-th frame period. For example, if N remains 2, a third comparison is performed during a third frame period for the third pixel row, and a sum of results of the second and third comparisons is used to adjust the panel current during a fourth frame period. Accordingly, in the method of operating the OLED display device 100 according to exemplary embodiments, the panel current may be controlled by using the mobility sensing data MSD without a serial resistor for sensing the panel current, and thus a cost and power consumption of the OLED display device 100 may be reduced.

Figure 13:
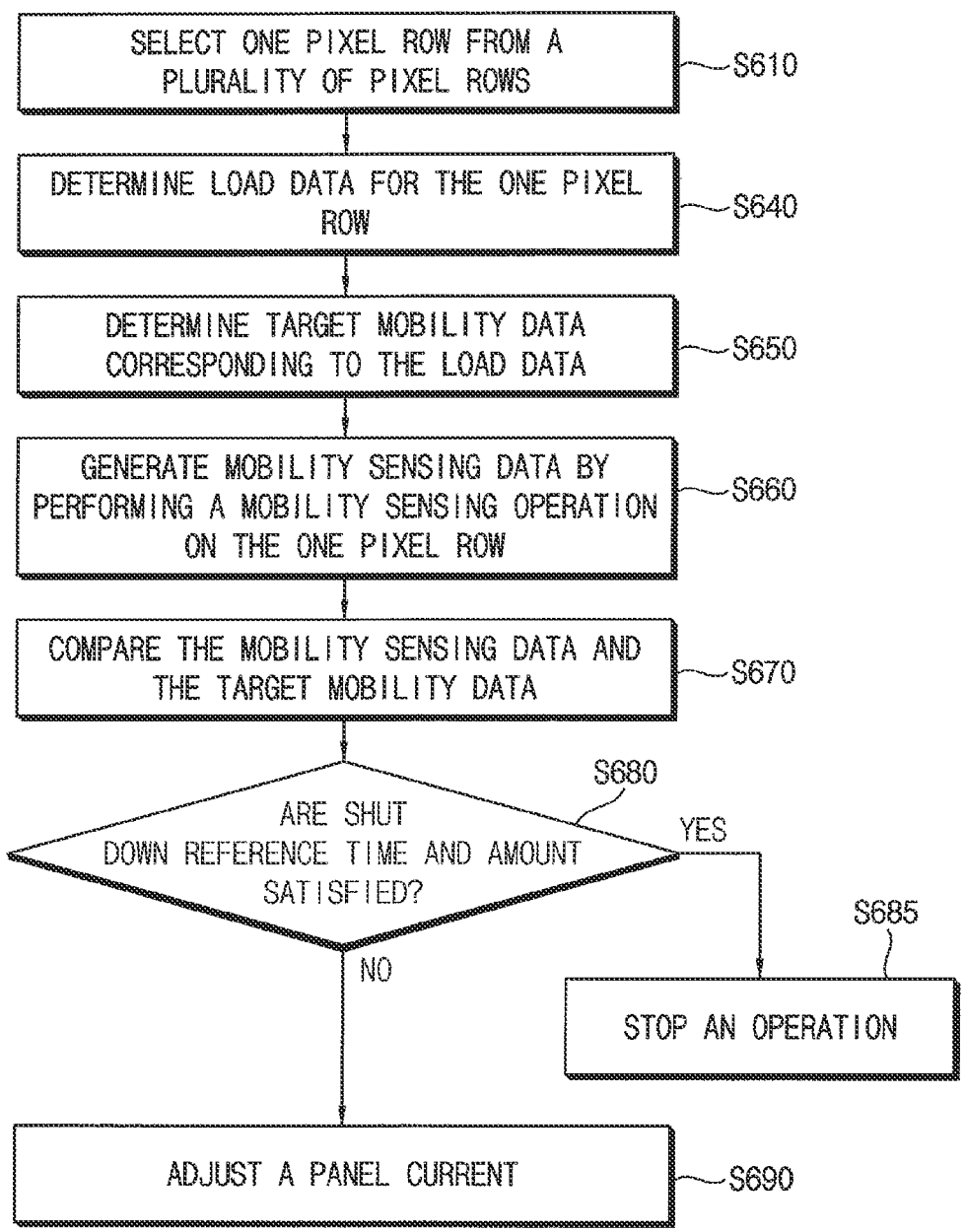
FIG. 13 is a flowchart illustrating a method of operating an OLED display device according to an exemplary embodiment of the disclosure.

FIG. 13 is a flowchart illustrating a method of operating an OLED display device according to an exemplary embodiment of the disclosure.

Referring to FIGS. 1 and 13, in a method of operating an OLED display device 100 including a display panel 110 having a plurality of pixel rows PXR1, PXR2, ..., PXRN, a target mobility determining block 180 selects one pixel row on which a mobility sensing operation is to be performed from the plurality of pixel rows PXR1, PXR2, ..., PXRN (S610), determines load data based on input image data IDAT for the selected one pixel row (S640), and determines target mobility data TMD corresponding to the load data (S650). A sensing circuit 160 generates mobility sensing data MSD by performing the mobility sensing operation on the selected one pixel row (S660). A current control block 190 compares the mobility sensing data MSD and the target mobility data TMD (S670). An overcurrent protection circuit 195 included in the current control block 190 selectively stops an operation of the OLED display device 100 according to whether a difference between the mobility sensing data MSD and the target mobility data TMD satisfies a shut down reference time and a shut down reference amount (S680 and S685). For example, if the difference is within a certain range for a certain amount of time, the operation of the OLED display device 100 is stopped. In a case where the difference between the mobility sensing data MSD and the target mobility data TMD does not satisfy the shut down reference time and the shut down reference amount (S680: NO), the operation of the OLED display device 100 is not stopped. The current control block 190 adjusts a panel current flowing through the display panel 110 according to a result of the comparison of the mobility sensing data MSD and the target mobility data TMD (S690).

In a case where the difference between the mobility sensing data MSD and the target mobility data TMD satisfies the shut down reference time and the shut down reference amount (S680: YES), or in a case where the mobility sensing data MSD is greater by more than the shut down reference amount than the target mobility data TMD during a plurality of frame periods (e.g., 60 frame periods) corresponding to the shut down reference time, the overcurrent protection circuit 195 determines that an overcurrent occurs in the display panel 110, and stops the operation of the OLED display device 100 (S685). Accordingly, in the OLED display device 100 according to an exemplary embodiment of the disclosure, since the overcurrent is detected by using the mobility sensing data MSD, even if the load data represents a low load, the overcurrent may be accurately detected, and an overcurrent protection operation of the overcurrent protection circuit 195 may be performed normally.

Figure 14:
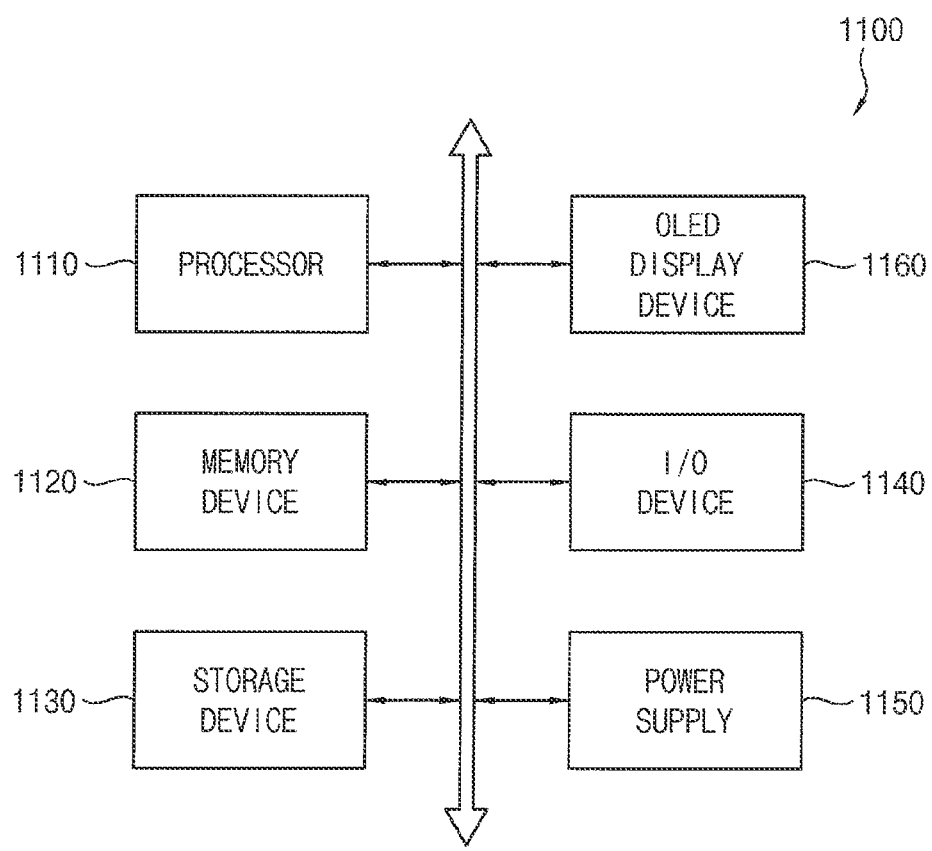
FIG. 14 is a block diagram illustrating an electronic device including an OLED display device according to an exemplary embodiment of the disclosure.

FIG. 14 is a block diagram illustrating an electronic device including an OLED display device according to an exemplary embodiment of the disclosure.

Referring to FIG. 14, an electronic device 1100 includes a processor 1110, a memory device 1120, a storage device 1130, an input/output (I/O) device 1140, a power supply 1150, and an OLED display device 1160. The electronic device 1100 may further include a plurality of ports for communicating a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be coupled to other components via an address bus, a control bus, a data bus, etc. Further, in some exemplary embodiments, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc, and an output device such as a printer, a speaker, etc. The power supply 1150 may supply power for operations of the electronic device 1100. The OLED display device 1160 may be coupled to other components through the buses or other communication links.

In the OLED display device 1160 according to an exemplary embodiment of the disclosure, one pixel row is selected from a plurality of pixel rows, load data is determined based on input image data for the selected one pixel row, target mobility data corresponding to the load data is determined, mobility sensing data is generated by performing a mobility sensing operation for the selected one pixel row, and a panel current may be adjusted by comparing the mobility sensing data and the target mobility data. Accordingly, the OLED display device 1160 may control the panel current by using the mobility sensing data without a serial resistor for sensing the panel current, and thus a cost and power consumption of the OLED display device 1160 may be reduced. Further, in some exemplary embodiments, the OLED display device 1160 may perform an overcurrent protection operation by using the mobility sensing data.

The inventive concepts may be applied any electronic device 1100 including the OLED display device 1160. For example, the inventive concepts may be applied to a television (TV), a digital TV, a 3D TV, a smart phone, a wearable electronic device, a tablet computer, a mobile phone, a personal computer (PC), a home appliance, a laptop computer, a personal digital assistant (PDA), a portable multimedia player (PMP), a digital camera, a music player, a portable game console, a navigation device, etc.

Although a few exemplary embodiments have been described, those skilled in the art will readily appreciate that many modifications are possible in the exemplary embodiments without materially departing from the present inven-

What is claimed is:

1. An organic light emitting diode (OLED) display device comprising:
   a display panel including a plurality of pixel rows; and
   a panel driver configured to drive the display panel, the panel driver comprising:
      a determining circuit configured to select one pixel row from the plurality of pixel rows, to determine load data based on input image data for the selected one pixel row, and to determine target mobility data corresponding to the load data;
      a sensing circuit configured to generate mobility sensing data corresponding to mobility values of driving transistors of a plurality of pixels included in the selected one pixel row by performing a mobility sensing operation on the selected one pixel row; and
      a current control circuit configured to compare the mobility sensing data and the target mobility data to generate a result, and to adjust a panel current flowing through the display panel according to the result.

2. The OLED display device of claim 1, wherein the determining circuit calculates a plurality of pixel row load data for the plurality of pixel rows based on the input image data for the plurality of pixel rows, and selects the one pixel row having largest pixel row load data among the plurality of pixel row load data of the plurality of pixel rows.

3. The OLED display device of claim 1, wherein the selected one pixel row is an uppermost pixel row or a lowermost pixel row among the plurality of pixel rows.

4. The OLED display device of claim 1, wherein the determining circuit sequentially selects the plurality of pixel rows such that the one pixel row is changed per frame period.

5. The OLED display device of claim 1, wherein the determining circuit calculates the load data by dividing the input image data for the selected one pixel row by maximum image data for the one pixel row.

6. The OLED display device of claim 1, wherein the determining circuit determines the target mobility data as maximum target mobility data corresponding to reference load data when the load data is greater than or equal to the reference load data.

7. The OLED display device of claim 1, wherein the determining circuit includes a memory device configured to store a plurality of target mobility values respectively corresponding to a plurality of load values, and determines the target mobility data corresponding to the load data by using the memory device.

8. The OLED display device of claim 7, wherein the determining circuit determines two load values adjacent to a load value represented by the load data among the plurality of load values, obtains two target mobility values corresponding to the two load values among the plurality of target mobility values from the memory device, and interpolates the target mobility data from the two target mobility values.

9. The OLED display device of claim 7, wherein the plurality of target mobility values stored in the memory device is measured by using the sensing circuit before an aging process for the display panel is performed.

10. The OLED display device of claim 1, wherein, in a sensing period of each frame period, the panel driver applies a reference voltage to the plurality of pixels included in the selected one pixel row, detects sensing voltage changes of a plurality of sensing lines coupled to the plurality of pixels during a sensing time within the sensing period by using the sensing circuit, and generates the mobility sensing data based on the sensing voltage changes.

11. The OLED display device of claim 1, wherein the current control circuit decreases the panel current when the mobility sensing data is greater than the target mobility data, and increases the panel current when the mobility sensing data is less than the target mobility data.

12. The OLED display device of claim 1, wherein, when the mobility sensing data is greater than the target mobility data, the current control circuit generates output image data provided to a data driver included in the panel driver by decreasing the input image data for the plurality of pixel rows such that data voltages applied to the plurality of pixel rows are decreased, and
   wherein, when the mobility sensing data is less than the target mobility data, the current control circuit generates the output image data provided to the data driver by increasing the input image data for the plurality of pixel rows such that the data voltages applied to the plurality of pixel rows are increased.

13. The OLED display device of claim 1, wherein the panel driver further comprises:
   an overcurrent protection circuit configured to stop an operation of the OLED display device when the mobility sensing data is greater by more than a shut down reference amount than the target mobility data during a plurality of frame periods corresponding to a shut down reference time.

14. A method of operating an organic light emitting diode (OLED) display device including a display panel having a plurality of pixel rows, the method comprising:
   selecting one pixel row from the plurality of pixel rows;
   determining load data based on input image data for the selected one pixel row;
   determining target mobility data corresponding to the load data;
   generating mobility sensing data corresponding to mobility values of driving transistors of a plurality of pixels included in the one pixel row by performing a mobility sensing operation on the selected one pixel row;
   comparing the mobility sensing data and the target mobility data to generate a result; and
   adjusting a panel current flowing through the display panel according to the result.

15. The method of claim 14, wherein selecting the one pixel row comprises:
   calculating a plurality of pixel row load data for the plurality of pixel rows based on the input image data for the plurality of pixel rows; and
   selecting the one pixel row having largest pixel row load data among the plurality of pixel row load data of the plurality of pixel rows.

16. The method of claim 14, wherein adjusting the panel current comprises:
   decreasing the panel current when the mobility sensing data is greater than the target mobility data; and
   increasing the panel current when the mobility sensing data is less than the target mobility data.

17. The method of claim 14, further comprising:
   stopping an operation of the OLED display device when the mobility sensing data is greater by more than a shut down reference amount than the target mobility data during a plurality of frame periods corresponding to a shut down reference time.

18. An organic light emitting diode (OLED) display device comprising:
- a display panel including a plurality of pixel rows, a plurality of data lines, and a plurality of sensing lines, where each pixel row includes a plurality of pixels and each pixel is connected to a corresponding one of the data lines and a corresponding one of the sensing lines; and
- a panel driver configured to drive the display panel,
- wherein the panel driver is configured to output data voltages to the data lines during an active period of a frame period and sense sensing voltages from the sensing lines during a sensing period of the frame period,
- wherein the panel driver is configured to determine a load data from the sensing voltages received from one of the pixel rows, determine mobility data from the load data, compare the mobility data with a target value to generate a result, and adjust panel current of the display panel based on the result.

19. The organic light emitting diode (OLED) display device of claim 18, wherein the panel driver comprises a current control circuit configured to stop an operation of the OLED display device when the mobility data exceeds the target value for more than N frame periods, where N is at least one.

20. The organic light emitting diode (OLED) display device of claim 18, wherein the panel driver increases the panel current when the mobility data exceeds the target value and a temperature is greater than a threshold.

* * * * *